(12) United States Patent
Murphy

(10) Patent No.: US 7,872,422 B2
(45) Date of Patent: Jan. 18, 2011

(54) ION SOURCE WITH RECESS IN ELECTRODE

(75) Inventor: Nestor P. Murphy, Oxford, MI (US)

(73) Assignee: Guardian Industries Corp., Auburn Hills, MI (US)

(*) Notice: Subject to any disclaimer, the term of this patent is extended or adjusted under 35 U.S.C. 154(b) by 608 days.

(21) Appl. No.: 11/488,189

(22) Filed: Jul. 18, 2006

(65) Prior Publication Data
US 2008/0017112 A1 Jan. 24, 2008

(51) Int. Cl.
*H01J 7/24* (2006.01)

(52) U.S. Cl. .............................. 315/111.81; 315/111.91; 250/423 R

(58) Field of Classification Search ............ 315/111.21, 315/111.81, 111.01, 111.91; 250/423 R, 250/424, 426; 118/723 FI
See application file for complete search history.

(56) References Cited

U.S. PATENT DOCUMENTS

| | | | |
|---|---|---|---|
| 3,678,267 A | 7/1972 | Werner | |
| 5,576,600 A * | 11/1996 | McCrary et al. | ....... 315/111.81 |
| 5,945,781 A | 8/1999 | Valentian | |
| 6,002,208 A | 12/1999 | Maishev et al. | |
| 6,037,717 A | 3/2000 | Maishev et al. | |
| 6,238,526 B1 | 5/2001 | Maishev et al. | |
| 6,359,388 B1 | 3/2002 | Petrmichl | |
| 6,501,078 B1 * | 12/2002 | Ryding et al. | ............ 250/423 R |
| 6,525,480 B1 * | 2/2003 | Hargus et al. | .......... 315/111.21 |
| 6,750,600 B2 | 6/2004 | Kaufman et al. | |
| 6,812,648 B2 | 11/2004 | Luten et al. | |
| 6,815,690 B2 | 11/2004 | Veerasamy et al. | |
| 6,987,364 B2 | 1/2006 | Petrmichl | |
| 6,988,463 B2 | 1/2006 | Veerasamy et al. | |
| 7,030,390 B2 | 4/2006 | Veerasamy et al. | |
| 2004/0075060 A1 * | 4/2004 | Luten et al. | ............. 250/423 R |
| 2005/0247885 A1 | 11/2005 | Madocks | |
| 2006/0103319 A1 | 5/2006 | Luten et al. | |

FOREIGN PATENT DOCUMENTS

SU 2 030 807 3/1995

* cited by examiner

*Primary Examiner*—Douglas W Owens
*Assistant Examiner*—Jimmy T Vu
(74) *Attorney, Agent, or Firm*—Nixon & Vanderhye P.C.

(57) ABSTRACT

An ion source capable of generating and/or emitting an ion beam which may be used to deposit a layer on a substrate or to perform other functions is provided. The ion source includes at least one anode and at least one cathode. In certain example embodiments, the anode may have a recess formed therein in which ions to be included in the ion beam may accelerate. Walls of the recess optionally may be insulated using, for example, ceramic. One or more holes may be provided to allow a supply of gas to flow into the recess, and those holes optionally may be tapered such that they narrow towards the recess. Thus, certain example embodiments produce an ion source having a higher energy efficiency (e.g., having increasing ion energy).

15 Claims, 4 Drawing Sheets

ION SOURCE WITH RECESS IN ELECTRODE

FIELD OF THE INVENTION

The example embodiments herein relate to an ion source for generating an ion beam (diffuse, focused, or collimated). In certain example embodiments of this invention, an extended acceleration zone is created by forming a recess in an electrode (e.g., anode and/or a cathode) of the ion source.

BACKGROUND AND SUMMARY OF EXAMPLE EMBODIMENTS OF THE INVENTION

An ion source is a device that causes gas molecules to be ionized and then accelerates and emits the ionized gas molecules and/or atoms in a beam towards a substrate. Such an ion beam may be used for various purposes, including but not limited to cleaning a substrate, activation, polishing, etching, and/or deposition of thin-film coatings/layer(s). Example ion sources are disclosed, for example, in U.S. Pat. Nos. 7,030,390; 6,988,463; 6,987,364; 6,815,690; 6,812,648; and 6,359,388; the disclosures of which are all hereby incorporated herein by reference.

FIGS. 1-2 illustrate a conventional cold-cathode closed drift type ion source. In particular, FIG. 1 is a side cross-sectional view of an ion beam source with an ion beam emitting slit defined in the cathode, and FIG. 2 is a corresponding sectional plan view along section line II-II of FIG. 1. FIG. 3 is a sectional plan view similar to FIG. 2, for purposes of illustrating that the FIG. 1 ion beam source may have an oval and/or racetrack-shaped ion beam emitting slit as opposed to a circular ion beam emitting slit. Any other suitable shape also may be used.

Referring to FIGS. 1-3, the ion source includes a hollow housing made of a magnetoconductive material such as steel, which is used as a cathode 5. Cathode 5 includes cylindrical or oval side wall 7, a closed or partially closed bottom wall 9, and an approximately flat top wall 11 in which a circular or oval ion emitting slit and/or aperture (also sometimes referred to as a "discharge gap") 15 is defined. The bottom wall 9 and side wall 7 of the cathode 5 are optional. Ion emitting slit/aperture 15 includes an inner periphery as well as an outer periphery. The portion of top cathode wall 5, 11 inside of the slit 15 is considered the inner cathode, whereas the portion of the top cathode wall 5, 11 outside of the slit 15 is considered the outer cathode. Deposit and/or maintenance gas supply aperture or hole(s) 21 is/are formed in bottom wall 9. Flat top wall 11 of the cathode functions as an accelerating electrode. A magnetic system including a cylindrical magnet 23 with poles N and S of opposite polarity is placed inside the housing between bottom wall 9 and top wall 11. The N-pole faces flat top wall 11, while the S-pole faces bottom wall 9. The purpose of the magnetic system with a closed magnetic circuit formed by the magnet 23 and cathode 5 is to induce a substantially transverse magnetic field (MF) in an area proximate to ion emitting slit 15.

The ion source may be entirely or partially within conductive wall 50, and/or wall 50 may at least partially define the deposition chamber. In certain instances, wall 50 may entirely surround the source and substrate 45, while in other instances the wall 50 may only partially surround the ion source and/or substrate.

A circular or oval shaped conductive anode 25, electrically connected to the positive pole of electric power source 29, is arranged so as to at least partially surround magnet 23 and be approximately concentric therewith. Anode 25 may be fixed inside the housing by way of insulative ring 31 (e.g., of ceramic). Anode 25 defines a central opening therein in which magnet 23 is located. The negative pole of electric power source 29 is grounded and connected to cathode 5, so that the cathode is negative with respect to the anode. Generally speaking, the anode 25 is generally biased positive by several thousand volts. Meanwhile, the cathode (the term "cathode" as used herein includes the inner and/or outer portions thereof) is generally held at ground potential. One example of a conventional ion source includes an anode having a flat top surface approximately 2 mm from the bottom of both the inner and outer cathodes.

The conventional ion beam source of FIGS. 1-3 is intended for the formation of a unilaterally directed tubular ion beam, flowing in the direction toward substrate 45. Substrate 45 may or may not be biased in different instances. The ion beam emitted from the area of slit/aperture 15 is in the form of a circle in the FIG. 2 embodiment and in the form of an oval (e.g., race-track) in the FIG. 3 embodiment. The conventional ion beam source of FIGS. 1-3 operates as follows in a depositing mode when it is desired that the ion beam deposit at least one layer on substrate 45. A vacuum chamber in which the substrate 45 and slit/aperture 15 are located is evacuated, and a depositing gas (e.g., a hydrocarbon gas such as acetylene, or the like) is fed into the interior of the source via aperture(s) 21 or in any other suitable manner. A maintenance gas (e.g., argon) may also be fed into the source in certain instances, along with or instead of the depositing gas. Power supply 29 is activated and an electric field is generated between anode 25 and cathode 5, which accelerates electrons to high energy. Anode 25 is positively biased by several thousand volts, and cathode 5 is at ground potential as shown in FIG. 1. Electron collisions with the gas in, and/or proximate to, aperture/slit 15 leads to ionization and a plasma is generated. "Plasma" herein means a cloud of gas including ions of a material to be accelerated toward substrate 45. The plasma expands and fills (or at least partially fills) a region including slit/aperture 15. An electric field is produced in slit 15, oriented in the direction substantially perpendicular to the transverse magnetic field, which causes the ions to propagate toward substrate 45. Electrons in the ion acceleration space in and/or proximate to slit/aperture 15 are propelled by the known E×B drift in a closed loop path within the region of crossed electric and magnetic field lines proximate to slit/aperture 15. These circulating electrons contribute to ionization of the gas (the term "gas" as used herein means at least one gas), so that the zone of ionizing collisions extends beyond the electrical gap between the anode and cathode and includes the region proximate to slit/aperture 15 on one and/or both sides of the cathode 5. For purposes of example, consider the situation where a silane and/or acetylene ($C_2H_2$) depositing gas is/are utilized by the ion source of FIGS. 1-3 in a depositing mode. The silane and/or acetylene depositing gas passes through the gap between anode 25 and cathode 5.

Unfortunately, the ion source of FIGS. 1-3 suffers several drawbacks. For example, conventional ion sources have small zones in which the ions can accelerate, thus limiting the overall energy efficiency of the ion source. Lower energy efficiencies may decrease the associated ion energies, which is not desirable in certain instances. The ions may tend to drift, potentially resulting in a less focused or otherwise less efficient ion beam. Also, the depth to which ions can penetrate the target substrate, if desired, may be limited by a lower ion energy.

Thus, it will be appreciated that there exists a need in the art for an ion source that overcomes one or more of the aforesaid problems.

In certain example embodiments, an ion source capable of emitting an ion beam is provided. Such an ion source may comprise an anode and a cathode, with the anode and/or the cathode having a discharge gap (e.g., slit or the like) formed therein. At least one magnet capable of generating a magnetic field proximate to the discharge gap also may be provided. A power supply may be in electrical communication with the anode and/or the cathode. The anode and/or the cathode may have a recess formed therein in which ions to be included in the ion beam can accelerate, the recess having a base and at least first and second sidewalls which may extend upwardly from the base toward the discharge gap and/or toward the other of the anode or cathode. The ion beam may be emitted from an area in and/or proximate to the discharge gap.

According to certain example embodiments of this invention, the recess may optionally be in communication with one or more optional gas-flow holes or channels (the gas-flow holes or channels also being defined in the electrode in which the recess is defined) through which gas is capable of flowing. According to certain example embodiments, the one or more optional gas-flow holes or channels may be tapered such that the holes or channels narrow toward the recess.

In certain example embodiments of this invention, there is provided a ion source capable of emitting an ion beam, comprising: a cathode including a discharge gap defined therein; an anode located at least partially below the discharge gap; at least one magnet capable of generating a magnetic field proximate to the discharge gap; a power supply in electrical communication with the anode and/or the cathode; and a recess defined in a top surface of the anode, the recess having a base wall and sidewalls and being located at least partially below the discharge gap.

In other example embodiments of this invention, there is provided an ion source capable of emitting an ion beam, comprising: an anode and a cathode, one of the anode and cathode having a discharge gap defined therein and the other of the anode and cathode having a recess defined therein in a location proximate the discharge gap, the recess having a base wall and at least one sidewall; at least one magnet capable of generating a magnetic field proximate to the discharge gap; and a power supply in electrical communication with the anode and/or the cathode.

In still further example embodiments of this invention, there is provided a method of operating an ion source capable of emitting an ion beam, the method comprising: providing an ion source including an anode and a cathode, the anode and/or the cathode having a discharge gap formed therein, and the anode and/or the cathode being in electrical communication with a power supply; using at least one magnet to generate a magnetic field proximate to the discharge gap; and accelerating ions to be included in the ion beam in and/or proximate to a recess formed in the anode and/or the cathode, the recess including a base wall and at least one side wall.

According to certain example embodiments, the ion beam may be used for cleaning the substrate, activation, polishing the substrate, etching the substrate, and/or depositing thin-film coating(s)/layer(s) on the substrate.

BRIEF DESCRIPTION OF THE DRAWINGS

These and other features and advantages will be better and more completely understood by reference to the following detailed description of exemplary illustrative embodiments in conjunction with the drawings, of which.

Figure 1:
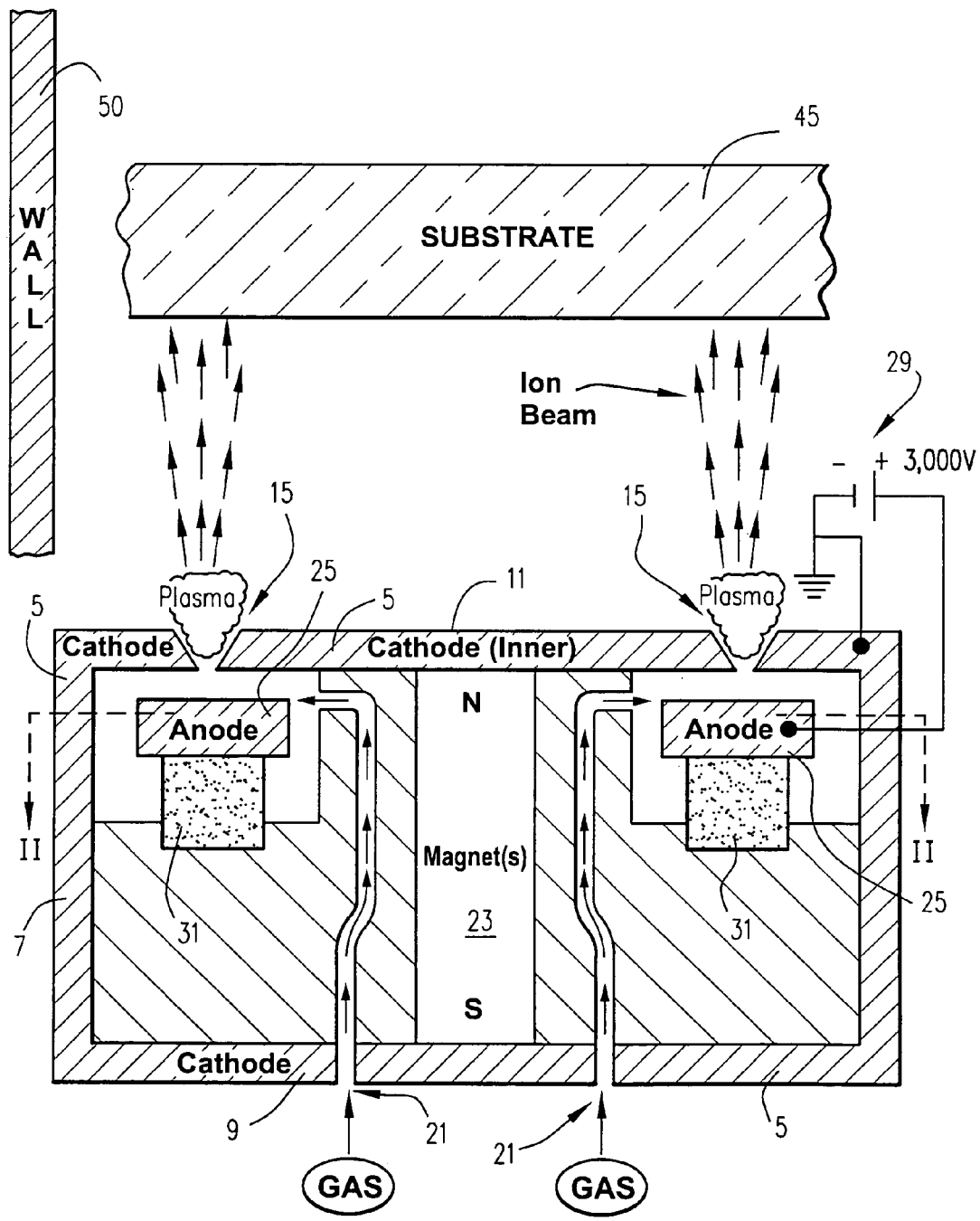
FIG. 1 is a schematic partial cross-sectional view of a conventional ion source.

DETAILED DESCRIPTION OF EXAMPLE
EMBODIMENTS OF THE INVENTION OF THE
INVENTION

Referring now more particularly to the accompanying drawings in which like reference numerals indicate like parts throughout the several views.

Figure 3:
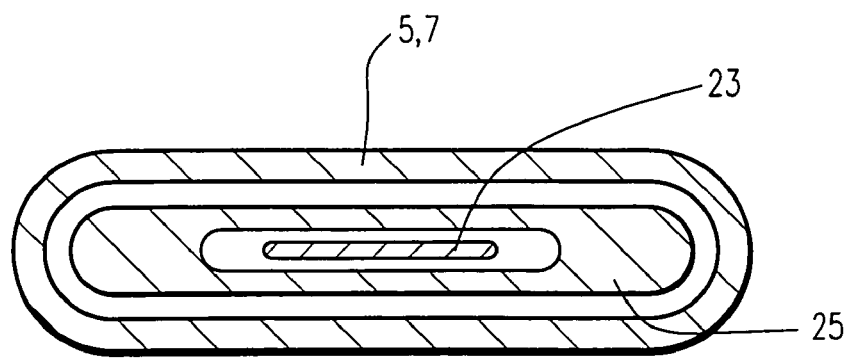
FIG. 3 is a sectional view similar to FIG. 2, taken along section line II-II in FIG. 1, in another embodiment illustrating that the ion source may be shaped in an oval manner instead of in a circular manner.
Figure 4:
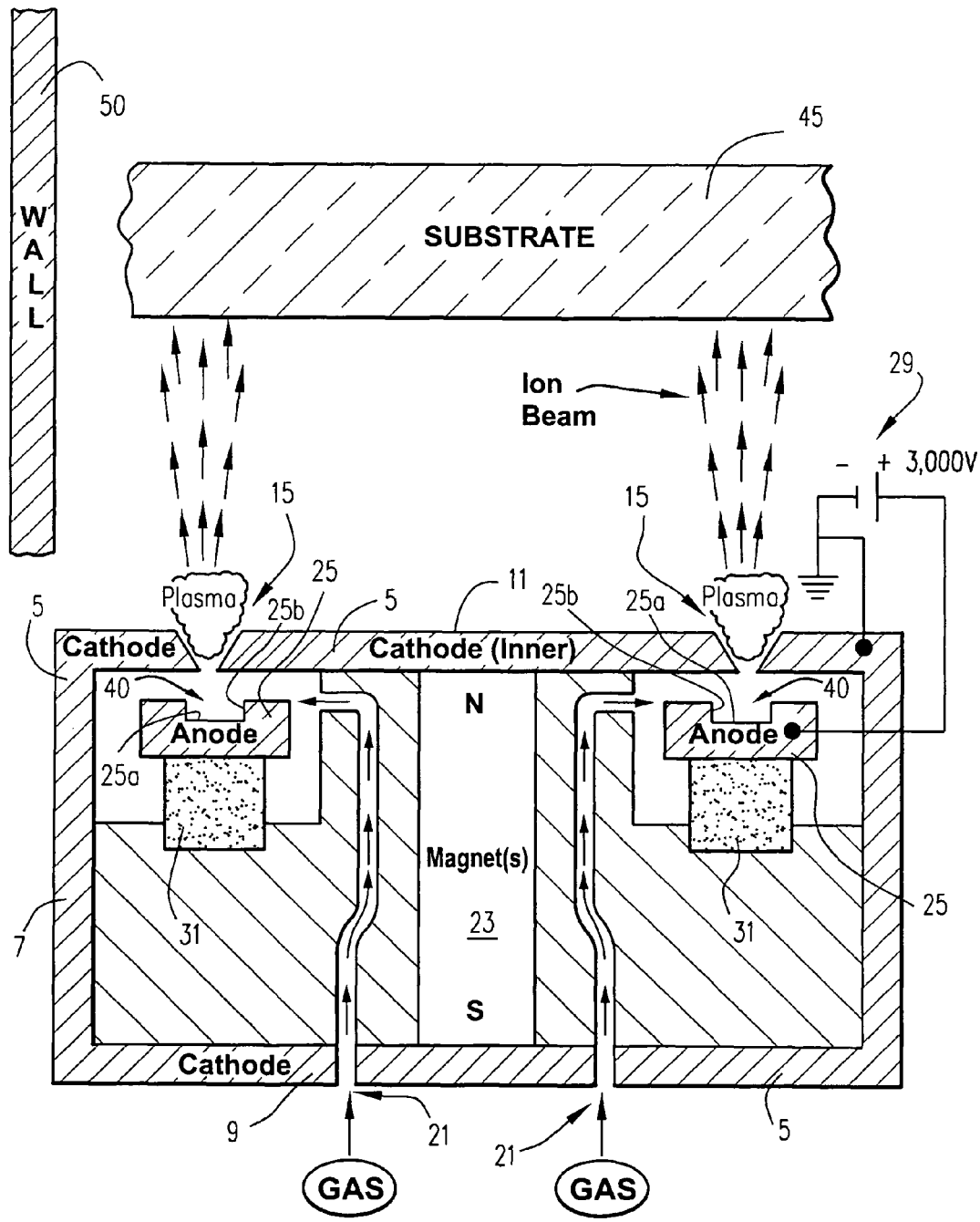
FIG. 4 is a schematic partial cross sectional view of an ion source according to an example embodiment of this invention; and, FIG. 5 is an enlarged side cross-sectional view of an example recess illustrating example gas-flow holes or channels in communication with the recess.

FIG. 4 is a cross sectional view of a cold cathode closed-drift ion source according to an example embodiment of this invention. The example embodiment shown in FIG. 4 functions similarly in many respects to the conventional ion source depicted with reference to FIGS. 1-3, and for this reason like references numerals are used in FIGS. 1-5.

Figure 2:
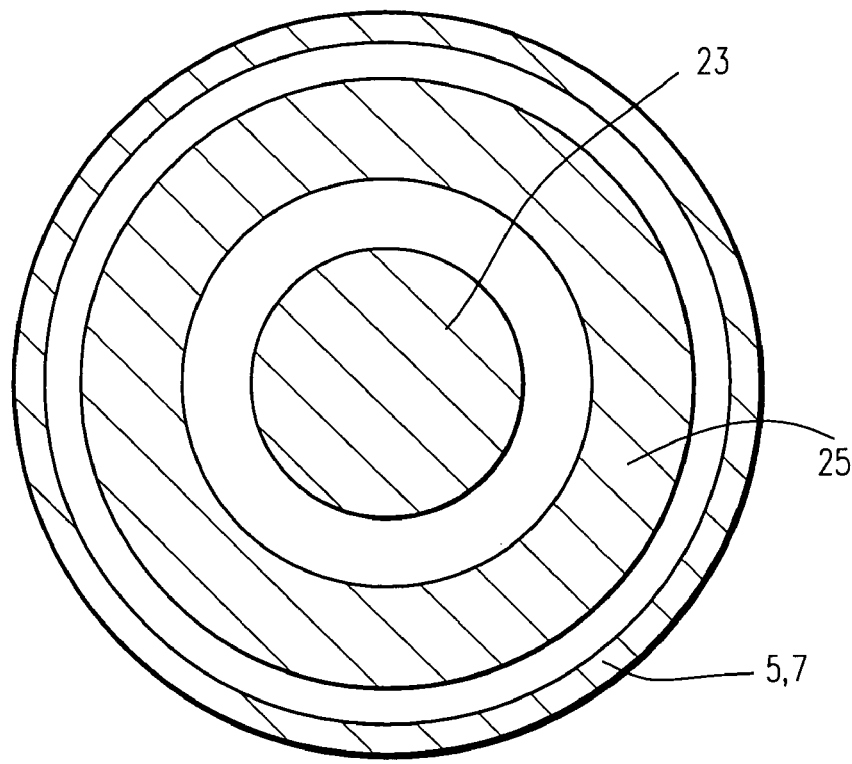
FIG. 2 is a sectional view taken along section line II-II of FIG. 1.

In the FIG. 4 example embodiment ion source, the slit/aperture (or discharge gap) 15 is formed in the cathode 5, so that the cathode has inner and outer portions as shown in the figure. Anode 25 is located below the cathode 5 and/or below the discharge gap or slit 15 defined therein. As shown in FIGS. 2-3, the anode 25 may be circular, oval, or otherwise shaped as viewed in a top-cross-sectional perspective in different example embodiments of this invention; and the discharge gap or slit 15 may be similarly shaped. Electrons in the ion acceleration space in and/or proximate to slit/aperture (or discharge gap) 15 are propelled by the E×B drift in a closed loop path within the region of crossed electric and magnetic field lines proximate to slit/aperture (or discharge gap) 15. These circulating electrons contribute to the ionization of the gas, so that the zone of ionizing collisions extends beyond the electrical gap between the anode 25 and cathode 5 and includes the region proximate to slit/aperture 15 on one and/or both sides of the cathode 5.

Unlike the conventional arrangement of FIGS. 1-3, however, the example embodiment shown in FIG. 4 includes a recess 40 defined in the top surface of anode 25. The recess 40 is defined in the surface of the anode facing the discharge gap 15 and/or cathode 5. Recess 40 effectively increases the acceleration zone, allowing electrons in the now larger ion acceleration space in and/or proximate to the recess 40 and in and/or proximate to slit/aperture (or discharge gap) 15 to be propelled in a more efficient manner. Moreover, it is noted that the zone of ionizing collisions may extend beyond the electrical gap between the anode 25 and cathode 5 and include the region proximate to slit/aperture 15 on one or both sides of the cathode 5.

Providing an increased acceleration zone is advantageous for several example reasons. For example, increasing the acceleration zone may allow for higher energy efficiency ion sources. Higher energy efficiency ion sources are advantageous for a variety of reasons, including but not limited to the increased ion energy that such example ion sources may provide. A higher ion energy may result in a greater ion penetration depth with respect to target substrate 45. Also, less drift may possibly create a more focused and therefore more efficient system.

As shown in FIG. 4, the recess 40 defined in the top surface of the anode 25 has a base wall 25a and at least a pair of sidewalls 25b which are formed by the surrounding anode 25. The base wall 25a of the recess 40 may be approximately parallel to one or both of the top wall of the anode 25 and/or the top wall 11 of the cathode 5 in certain example embodiments of this invention. The sidewalls 25b of the recess 40 may be vertically oriented, or otherwise inclined in certain example embodiments of this invention; sidewalls 25b may extend upwardly from the base 25a toward the discharge gap 15 and/or toward the cathode 5. One or both of the sidewalls 25b may form an angle of from about 40-140 degrees, more preferably from about 60-90 degrees, with the base 25a, in certain example embodiments of this invention.

In certain example embodiments of this invention, the recess 40 has a depth, from the top surface of the electrode in which it is formed (e.g., anode 25), of from about 1 to 10 mm, more preferably from about 1 to 5 mm, and most preferably from about 2.5 to 3.5 mm. Moreover, in certain example embodiments the recess 40 has a width, from one sidewall 25b to the other sidewall 25b, of from about 1 to 10 mm, more preferably from about 1 to 5 mm, and most preferably from about 2.5 to 3 mm. In certain example embodiments, the depth and width of the recess are approximately equal. In certain example embodiments, the depth and width of the recess 40 do not differ from one another by more than about 2 mm, more preferably do not different from one another by more than about 1 mm. It has been found that such the width and depth dimensions for the recess 40 are particularly advantageous for increasing the ion acceleration zone from the electrode (e.g., anode 25) to the discharge gap 15. The increased acceleration zone can provide higher energy efficiency, increasing ion energy which may be desirable in certain situations.

Figure 5:
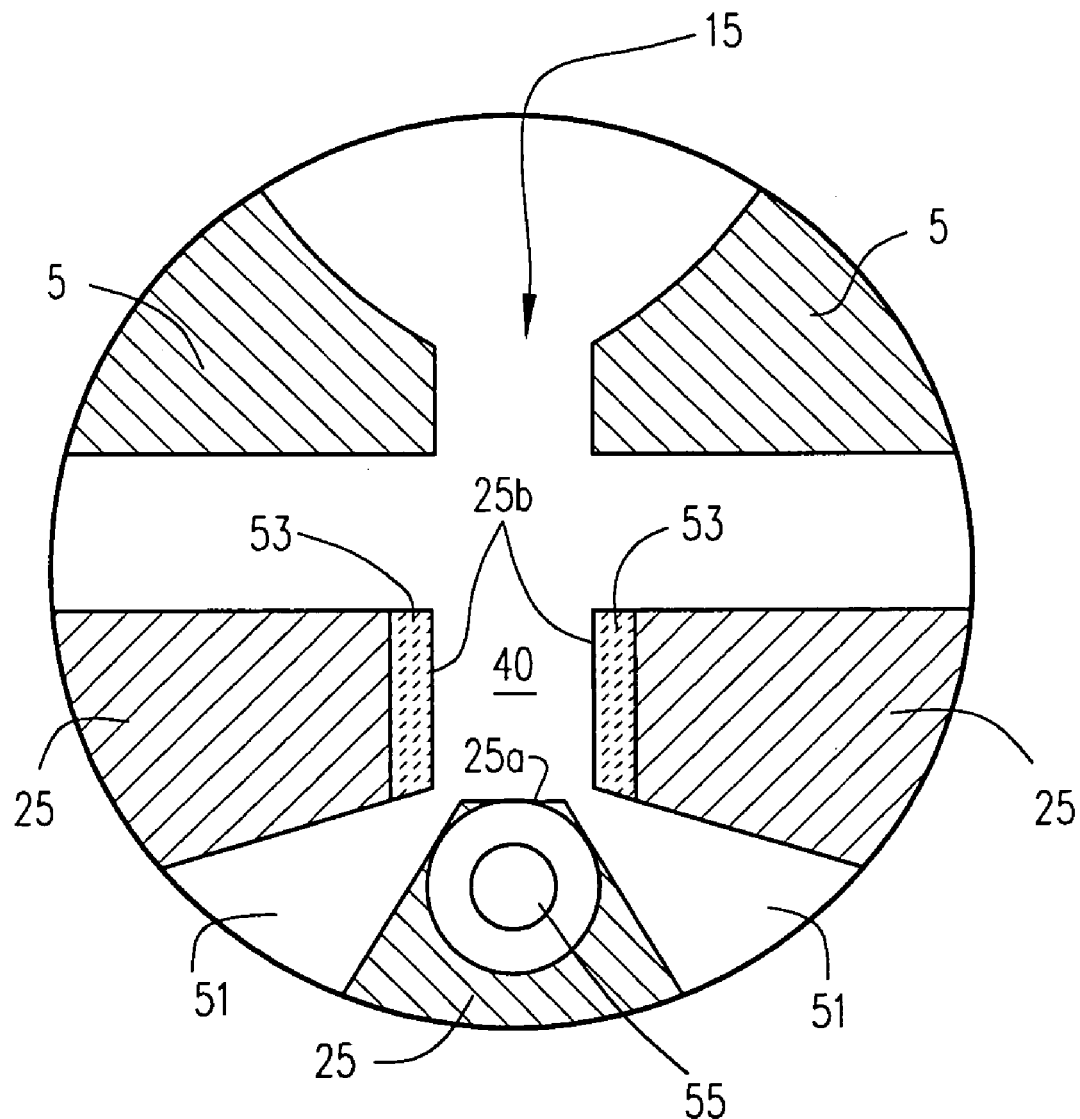

In certain example embodiments of this invention, it is optional to provide such a recess 40 which is in communication with one or more optional gas-flow holes or channels (the gas-flow holes or channels also being defined in the electrode, anode or cathode, in which the recess 40 is defined) through which gas is capable of flowing. According to certain example embodiments, the one or more optional gas-flow holes or channels may be tapered such that the holes or channels narrow toward the recess. In this respect, FIG. 5 is a side cross-sectional view of an example recess 40 defined in an anode 25. In the FIG. 5 example embodiment, recess 40 is shown in the anode 25 and below cathode 5.

Optional gas-flow holes or channels 51 are shown in the anode 25, in FIG. 5. Gas (e.g., argon, acetylene, etc.) for the ion source may enter the recess 40 through gas-flow hole(s) or channel(s) 51, which may taper as they extend through the anode and approach recess 40. This provides for an efficient way in which to feed gas into the relevant part of the ion source proximate the discharge gap so that it can be ionized. A suitable number of holes 51 may be located around anode 25. It will be appreciated that the exact size, placement, and shape of hole(s) 51 may be based on the particular example embodiment implemented, with design considerations that may include, for example, the location from which the gas is being fed, the size of the recess, etc. By way of example and without limitation, in FIG. 5, the two gas-flow holes/channels 51 may be provided towards the bottom of anode 25. Also by way of example and without limitation, the holes 51 may taper from approximately 1 mm to approximately 0.1 mm to allow gas into the recess 40 while helping to reduce the amount of ions escaping in a disadvantageous direction. In certain example embodiments of this invention, the size (e.g., diameter, or width) of one or more of the gas-flow holes/ channels 51 may decrease from about 0.2 to 5 mm, more preferably from about 0.5 to 1.5 mm, as the channels/holes 51 move from an outer portion of the anode 25 to the recess 40. It is noted that in embodiments where the holes/channels 51 are not present, the gas may be fed toward the discharge gap 15 as shown in FIG. 1, or in any other suitable manner.

In certain example embodiments of this invention, a water line 55 (e.g., for cooling the ion source, or for cooling at least portions thereof, etc.) may be provided. For purposes of example, FIG. 5 illustrates water line 55 formed in the anode 25 for cooling the same. In this particular example embodiment, the cooling water line 55 is located below the base 25a of the recess 40, although it may be located at other locations in other instances.

In certain example embodiments of this invention, because gas such as argon and/or acetylene, or other suitable gas(es), enters recess 40, deposits (e.g., insulating deposits) may build up on the surfaces of anode 25 or other electrode (e.g., cathode) in which the recess is formed. Such deposits may interfere with gas flow, and/or reduce net current, thereby adversely affecting the electric field potential. Thus, operability and/or efficiency of the ion beam source may be adversely affected despite the increased acceleration zone created by the recess. To reduce these and/or other problems, the walls (one or both of the sidewalls and base) of recess 40 may optionally be lined with an insulating material 53. For example, dielectric insert(s) and/or layer(s) 53 may be provided as shown in FIG. 5. With respect to the dielectric insert(s) and/or layer(s), the term dielectric herein means not nearly as conductive as the anode and cathode, but possibly having some small bit of conductivity. In certain example embodiments, insulating material 53 may be made of ceramic. However, it will be appreciated that other insulating materials may be used in combination with, or in place of, a ceramic. Insulator 53 may be provided on both the base and sidewalls of the recess 40, alternatively may be provided on only the sidewalls and not the base, and alternatively may be provided on only the base and not the sidewalls of the recess 40. In certain alternative embodiments of this invention, insulating coating 53 may be replaced with a layer of stainless steel or the like for coating the wall(s) of the anode 25 adjacent recess 40.

Certain example embodiments may comprise a method for achieving accelerated ions to be included in the ion beam. In such methods, an ion source including an anode and a cathode may be provided. The anode and/or the cathode may have a discharge gap formed therein, and the anode and/or the cathode may be in electrical communication with a power supply. At least one magnet may be used to generate a magnetic field proximate to the discharge gap. Then, ions to be included in the ion beam may be accelerated in and/or proximate to a recess formed in the anode and/or the cathode.

Optionally, surrounding (at least partially) the anode and/or the cathode with walls may form a chamber (e.g., a deposition chamber). This arrangement may allow a substrate to be provided in the chamber. The ion beam with the accelerated ions may be directed towards the substrate. With such example embodiments, it is possible to use the ion beam for cleaning the substrate, activation, polishing the substrate, etching the substrate, depositing thin-film coating(s)/layer(s) on the substrate, etc.

Although the example embodiments herein are described as having a recess formed in the anode layer, the invention is not so limited. For example, in an example system where the location of the cathode(s) and anode(s) are reversed (for example, reversed with respect to the ion source shown in FIG. 4, etc.), the cathode(s) may have recess(es) formed therein to accomplish the acceleration. Thus, the recess may be formed in either the anode or the cathode in different example embodiments of this invention.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An ion source capable of emitting an ion beam, comprising:
    a cathode including a discharge gap defined therein;
    an anode located at least partially below the discharge gap;
    at least one magnet capable of generating a magnetic field proximate to the discharge gap;
    a power supply in electrical communication with the anode and/or the cathode;
    a recess defined in a top surface of the anode, the recess having a base wall and sidewalls and being located at least partially below the discharge gap; and
    wherein the recess has a depth of from about 1 to 5 mm and a width of at least about 1 mm, and wherein the depth and width of the recess do not differ from one another by more than about 1 mm.

2. The ion source of claim 1, wherein an ion beam is emitted from an area in and/or proximate to the discharge gap, and wherein the recess is for extending an acceleration zone thereby increasing ion energy of the ion beam.

3. The ion source of claim 1, wherein the recess is in communication with at least one gas-flow channel which extends at least partially through the anode.

4. The ion source of claim 3, wherein the gas-flow channel is tapered such that it narrow towards the recess.

5. The ion source of claim 1, further comprising an insulating layer and/or a layer comprising stainless steel formed on the anode along at least part of at least one sidewall of the recess.

6. The ion source of claim 1, wherein at least one of the sidewalls of the recess forms an angle of from about 40-140 degrees with the base wall of the recess.

7. The ion source of claim 1, wherein at least one of the sidewalls of the recess forms an angle of from about 60-90 degrees with the base wall of the recess.

8. The ion source of claim 1, wherein the ion source is a cold cathode closed-drift type ion source.

9. An ion source capable of emitting an ion beam, comprising:
    an anode and a cathode, one of the anode and cathode having a discharge gap defined therein and the other of the anode and cathode having a recess defined therein in a location proximate the discharge gap, the recess having a base wall and at least one sidewall;
    at least one magnet capable of generating a magnetic field proximate to the discharge gap; and
    a power supply in electrical communication with the anode and/or the cathode, and wherein the recess has a depth of from about 1 to 5 mm and a width of at least about 1 mm, and wherein the depth and width of the recess do not differ from one another by more than about 1 mm.

10. The ion source of claim 9, wherein an ion beam is emitted from an area in and/or proximate to the discharge gap, and wherein the recess is for extending an acceleration zone thereby increasing ion energy of the ion beam.

11. The ion source of claim 9, wherein the recess comprises first and second sidewalls and is in communication with at least one gas-flow channel which extends at least partially through the other of the anode and cathode.

12. The ion source of claim 11, wherein the gas-flow channel is tapered such that it narrow towards the recess.

13. The ion source of claim 9, further comprising an insulating layer formed on the other of the anode and cathode along at least part of at least one sidewall of the recess.

14. The ion source of claim 9, wherein at least one sidewalls of the recess forms an angle of from about 40-140 degrees with the base wall of the recess.

15. A method of operating an ion source capable of emitting an ion beam, the method comprising:
    providing an ion source including an anode and a cathode, the anode and/or the cathode having a discharge gap formed therein, and the anode and/or the cathode being in electrical communication with a power supply;
    using at least one magnet to generate a magnetic field proximate to the discharge gap; and
    accelerating ions to be included in the ion beam in and/or proximate to a recess formed in the anode and/or the cathode, the recess including a base wall and at least one side wall, and wherein the recess has a depth of from about 1 to 5 mm and a width of at least 1 mm, and wherein the depth and width of the recess do not differ from one another by more than about 1 mm.

* * * * *